United States Patent
Ermert et al.

(10) Patent No.: US 12,221,691 B2
(45) Date of Patent: Feb. 11, 2025

(54) ORGANOTIN PRECURSOR COMPOUNDS

(71) Applicant: ENTEGRIS, INC., Billerica, MA (US)

(72) Inventors: David M. Ermert, Danbury, CT (US);
David Kuiper, Brookfield, CT (US);
Thomas M. Cameron, Newtown, CT (US)

(73) Assignee: ENTEGRIS, INC., Billerica, MA (US)

( * ) Notice: Subject to any disclaimer, the term of this patent is extended or adjusted under 35 U.S.C. 154(b) by 151 days.

(21) Appl. No.: 17/992,166

(22) Filed: Nov. 22, 2022

(65) Prior Publication Data

US 2023/0160058 A1      May 25, 2023

Related U.S. Application Data

(60) Provisional application No. 63/282,893, filed on Nov. 24, 2021.

(51) Int. Cl.
     *C23C 16/18*      (2006.01)
     *C07F 7/22*      (2006.01)
     *C23C 16/455*      (2006.01)

(52) U.S. Cl.
CPC ............ *C23C 16/18* (2013.01); *C07F 7/2284* (2013.01); *C23C 16/45553* (2013.01)

(58) Field of Classification Search
CPC ............................... C07F 7/2284; C23C 16/18
See application file for complete search history.

(56) References Cited

U.S. PATENT DOCUMENTS

| | | |
|---|---|---|
| 2014/0087544 A1 | 3/2014 | Tolle |
| 2017/0102612 A1 | 4/2017 | Meyers et al. |
| 2017/0146909 A1 | 5/2017 | Smith et al. |
| 2020/0041896 A1 | 2/2020 | Moon et al. |
| 2020/0371431 A1 * | 11/2020 | Xiao .................. G03F 1/24 |
| 2021/0013034 A1 * | 1/2021 | Wu ................ H01L 21/02181 |
| 2022/0306657 A1 | 9/2022 | Fabulyak et al. |

FOREIGN PATENT DOCUMENTS

| | | | | |
|---|---|---|---|---|
| WO | WO 2016/065219 | * | 4/2016 | |
| WO | WO-2016065219 A1 | * | 4/2016 | ........... C23C 16/345 |
| WO | 2019023797 A1 | | 2/2019 | |

OTHER PUBLICATIONS

Azuma et al., American Chemical Society, Organometallics, Macrocycles containing tin. Syntheses of symmetrical macrocycles containing two or four diphenylstanna units, vol. 3, No. 1, pp. 9-14, 1984.

Bruin et al., Journal of Organometallic Chemistry, Some applications of the methylene di-Grignard reagent for the synthesis of main group IV organometallic compounds, vol. 288, pp. 13-25, 1985.

Herve et al., Stille Cross-Coupling of Activated Alkyltin Reagents under "Ligandless" Conditions, J. Org. Chem. 2005, 70 (5), 1953-1956 (https://doi.org/10.1021/jo047907q).

Jousseaume et al., American Chemical Society, Organometallics, A General Route to Alkylene-, Arylene-, or Benzylene-Bridged Ditin Hexachlorides and Hexaalkynides, vol. 21, No. 22, pp. 4590-4594, 2002.

Beckmann et al., Understanding ring strain and ring flexibility in six- and eight-membered cyclic organometallic group 14 oxides, Journal of Molecular Structure: THEOCHEM, vol. 761, pp. 177-139, 2006.

Davydova et al., Structures and stability of Cl—M—N—H rings and cages (M=Si, Ge, Sn, Ti), Molecular Physics, vol. 107, Nos. 8-12, pp. 899-910, 2009.

* cited by examiner

*Primary Examiner* — Elizabeth A Burkhart

(57) ABSTRACT

The invention provides certain organotin compounds which are believed to be useful in the vapor deposition of tin-containing films onto the surface of microelectronic device substrates, as well as in the deposition of EUV-patternable films. Also provided are certain novel precursor compositions. Also disclosed are processes for using the novel precursors to form films.

8 Claims, No Drawings

ORGANOTIN PRECURSOR COMPOUNDS

PRIORITY CLAIM

This invention claims priority to U.S. provisional patent No. 63/282,893 with a filing date of Nov. 24, 2021, which is hereby incorporated by reference.

TECHNICAL FIELD

This invention belongs to the field of organotin chemistry. In particular, it relates to certain organotin precursor compounds.

BACKGROUND

Certain organometallic compounds have been shown to be useful as precursors in the deposition of highly pure metal oxide films in applications such as extreme ultraviolet (EUV) lithography techniques used in the manufacture of microelectronic devices. In this process, certain organometallic precursors are utilized in conjunction with counter-reactants to form a polymerized organometallic film. A pattern is then formed on the surface, exposing the EUV-patternable film involving exposure of the film using a patterned beam of EUV light, followed by exposing the resulting microelectronic device surface to a post exposure bake in ambient air. This treatment with patterned EUV light leaves some exposed portions of the surface and some non-exposed portions, thus enabling further manipulation and patterning due to the different physical and chemical differences in the two regions. See, for example, U.S. Patent Publication 2021/0013034.

Thus, a need exists for further development of precursor composition and counter-reactant pairings which can be used in this dry (photo)resist process

SUMMARY

In summary, the invention provides certain organotin compounds which are believed to be useful in the vapor deposition of tin-containing films onto the surface of microelectronic device substrates. Also provided are certain novel precursor compounds. In general, the precursor compounds of the invention are organotin compounds having two or three tin centers and having, for example, alkoxide and/or amide functional groups. The precursors are believed to be especially useful in EUV-patterning operations.

DETAILED DESCRIPTION

As used in this specification and the appended claims, the singular forms "a", "an", and "the" include plural referents unless the content clearly dictates otherwise. As used in this specification and the appended claims, the term "or" is generally employed in its sense including "and/or" unless the content clearly dictates otherwise.

The term "about" generally refers to a range of numbers that is considered equivalent to the recited value (e.g., having the same function or result). In many instances, the term "about" may include numbers that are rounded to the nearest significant figure.

Numerical ranges expressed using endpoints include all numbers subsumed within that range (e.g., 1 to 5 includes 1, 1.5, 2, 2.75, 3, 3.80, 4 and 5).

In one aspect, the invention provides a process for the deposition of a tin-containing film onto a surface of a microelectronic device in a reaction zone, which comprises introducing into the reaction zone, a precursor composition comprising at least one compound chosen from Formula (I):

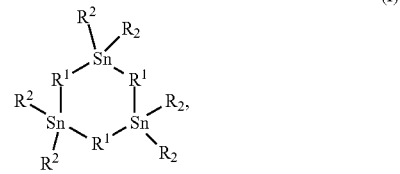

(I)

wherein $R^1$ is a group chosen from $-C(R)_2-$, $-CR(X)-$, $-O-$, and $-N(R)-$, wherein R is chosen from H and $C_1$-$C_5$ alkyl, wherein X is chosen from F, Cl, Br, I, $-OCH_3$, $-OCH_2CH_3$, $-OCH_2CH_2CH_3$, and $-OCH(CH_3)_2$, and $R^2$ is chosen from H, $-N(R)_2$, $-OR$, and $-R^1$;

under vapor deposition conditions.

The compounds of Formula (I) are believed to be useful as precursors in the vapor deposition of tin-containing films onto a substrate of a microelectronic device. As used herein, the term "tin-containing" films includes elemental tin, tin oxide, tin carbide, and tin nitride as well as differing proportions of each in a given film. In the case where an elemental tin film is desired, a reducing agent such as hydrogen may be utilized as a co-reactant. In the case where a tin nitride film is desired, and co-reactant such as ammonia or nitrogen may be utilized.

In another aspect, the invention provides a process for the deposition of a tin-containing film onto a surface of a microelectronic device in a reaction zone, which comprises introducing into the reaction zone, a precursor composition comprising at least one compound chosen from Formula (I):

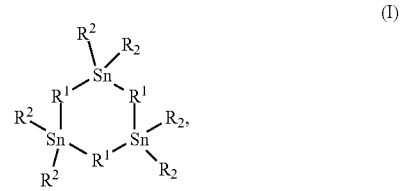

(I)

wherein $R^1$ is a divalent group chosen from $-C(R)_2-$, $-CR(X)-$, $-O-$, and $-N(R)-$, wherein R is chosen from H and $C_1$-$C_5$ alkyl, wherein X is chosen from F, Cl, Br, I, $-OCH_3$, $-OCH_2CH_3$, $-OCH_2CH_2CH_3$, and $-OCH(CH_3)_2$, and $R^2$ is chosen from H, $-N(R)_2$, and $-OR$, and $-R^1$; and at least one counter-reactant chosen from compounds capable of reacting with $-OR$ and $-N(R)_2$, under vapor deposition conditions.

In this regard, the compounds of Formula (I) are believed to be useful in EUV patterning operations when utilizing counter-reactants as set forth above.

In another aspect, the invention provides a process for the deposition of a tin-containing film onto a surface of a microelectronic device in a reaction zone, which comprises introducing into the reaction zone, a precursor composition comprising at least one compound chosen from Formula (II):

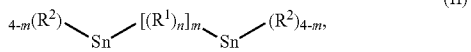

(II)

wherein $R^1$ is a divalent group chosen from —$CH_2$—, —C=C—, —C≡C—, —O—, —N(R)—, —O—R—R—O—, and —CH(X)—, wherein R is chosen from H and $C_1$-$C_5$ alkyl, wherein X is chosen from F, Cl, Br, I, —$OCH_3$, —$OCH_2CH_3$, —$OCH_2CH_2CH_3$, and —$OCH(CH_3)_2$, n is an integer of from 0 to 5, $R^2$ is chosen from H, —$N(R)_2$, and —OR, and —$R^1$; and m is an integer of from 0 to 2, under vapor deposition conditions.

As with the compounds of Formula (I), the compounds of Formula (II) are believed to be useful as precursors in the vapor deposition of tin-containing films onto a substrate of microelectronic device. The compounds of Formula (II) can thus be utilized in conjunction with various co-reactants in order to deposit the desired tin-containing film as elemental tin, tin oxide, and tin nitride. Additionally, when utilized in conjunction with counter-reactants as set forth below, the precursors and process can be used to prepare an EUV-patternable film.

Thus, in another aspect, the invention provides a process for the deposition of a tin-containing film onto a surface of a microelectronic device in a reaction zone, which comprises introducing into the reaction zone, a precursor composition comprising at least one compound chosen from Formula (II):

(II)

wherein $R^1$ is a divalent group chosen from —$CH_2$—, —C=C—, —C≡C—, —O—, —N(R)—, —O—R—R—O—, and —CH(X)—, wherein R is chosen from H and $C_1$-$C_5$ alkyl, wherein X is chosen from F, Cl, Br, I, —$OCH_3$, —$OCH_2CH_3$, —$OCH_2CH_2CH_3$, and —$OCH(CH_3)_2$, n is an integer of from 0 to 5, $R^2$ is chosen from H, —$N(R)_2$, and —OR, and —$R^1$; and m is an integer of from 0 to 2, and at least one counter-reactant chosen from compounds capable of reacting with —OR and —$N(R)_2$, under vapor deposition conditions.

The compounds of Formula (II), wherein the $R^2$ groups are amide groups, can be prepared according to the following Scheme I:

Scheme I.

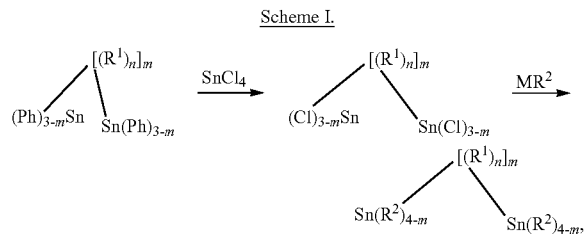

wherein $R^1$ and $R^2$ are as described above, and M is an alkaline or alkaline earth metal. Exemplary metals (M) include alkaline earth and alkali metal salts, including but not limited to lithium, sodium, potassium, magnesium, calcium, and zinc.

Additionally, the compounds of Formula (II) can be prepared according to the following Scheme II:

Scheme II.

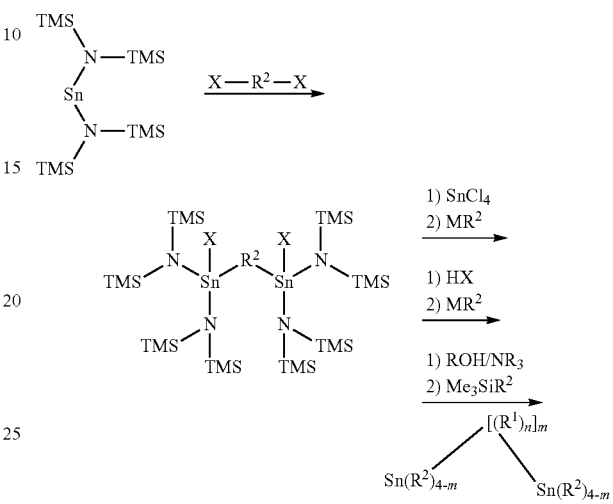

wherein "TMS" is trimethylsilyl.

See, for example "Stille Cross-Coupling of Activated Alkyltin Reagents under "Ligandless" Conditions", A. Herve, et al., *J. Org. Chem.* 2005, 70, 5, 1953-1956. In scheme II, $R^1$ and $R^2$ are as described above, and M is a transition metal. Exemplary metals (M) include alkaline earth and alkali metal salts, including but not limited to lithium, sodium, potassium, magnesium, calcium, and zinc, and X is a halogen atom.

The compounds of Formula (I) can be prepared according to the following Scheme III:

Scheme III

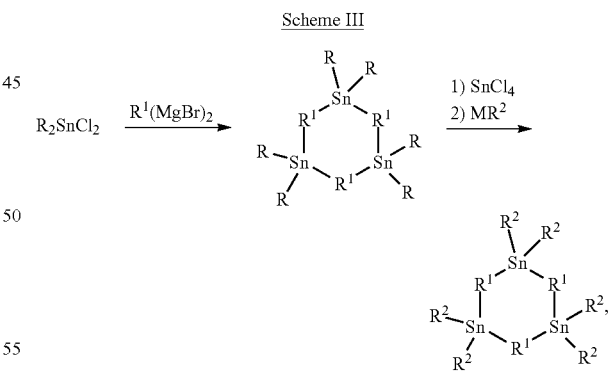

wherein R, $R^1$, and $R^2$ are as set forth above, and M is a transition metal. Exemplary metals (M) include alkaline earth and alkali metal salts, including but not limited to lithium, sodium, potassium, magnesium, calcium, and zinc.

See, for example (i) "Some Applications of the Methylene Di-Grignard Reagent for the Synthesis of Main Group IV Organometallic Compounds", J. W., Bruin, et al., *Journal of Organometallic Chemistry*, Volume 288, Issue 1, 11 Jun. 1985, pages 13-25; (ii) "A General Route to Alkylene-, Arylene-, or Benzylene-Bridged Ditin Hexachlorides and Hexaalkynides", B. Jousseaume, et al.,*Organometallics* 2002, 21, 22, 4590-4594; and (iii) "Macrocycles Containing Tin. Syntheses of Symmetrical Macrocycles Containing Two or Four Diphenylstanna Units", Y. Azuma et al., *Organometallics* 1984, 3, 1, 9-14.

In a further aspect, the invention provides certain compounds of Formula (I) and (II) which are believed to be useful as precursors herein. In one aspect, the invention provides a precursor composition comprising a compound of the formula:

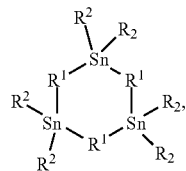

wherein $R^1$ is a group chosen from —C(R)$_2$—, —CR(X)—, —O—, and —N(R)—, wherein R is chosen from H and $C_1$-$C_5$ alkyl, wherein X is chosen from F, Cl, Br, I, —OCH$_3$, —OCH$_2$CH$_3$, —OCH$_2$CH$_2$CH$_3$, and —OCH(CH$_3$)$_2$, and $R^2$ is chosen from groups of the formula —N(R)$_2$ and —OR.

In this aspect, as well as for the compounds of Formula (I) and (II) herein, each R is independently chosen from hydrogen and $C_1$-$C_5$ alkyl; accordingly, groups of the formula —N(R)$_2$ include secondary amines of the formula —NHR.

In a further aspect, the invention provides a precursor composition comprising a compound of the formula:

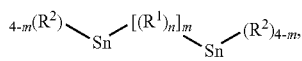

wherein $R^1$ is a group chosen from —CH$_2$—, —C=C—, —C≡C—, —O—, —N(R)—, —O—R—R—O—, and —CH(X)—, wherein R is chosen from H and $C_1$-$C_5$ alkyl, $R^2$ is a group of the formula —N(R)$_2$, and wherein X is chosen from F, Cl, Br, I, —OCH$_3$, —OCH$_2$CH$_3$, —OCH$_2$CH$_2$CH$_3$, and —OCH(CH$_3$)$_2$.

In this aspect, each R is independently chosen from hydrogen and $C_1$-$C_5$ alkyl; accordingly, groups of the formula —N(R)$_2$ include secondary amines of the formula —NHR.

As noted above, these organotin precursor compounds are believed to be useful in various vapor deposition processes when the deposition of a tin-containing film onto a surface of a microelectronic device is desired.

Also as noted above, the precursors of the invention are believed to be particularly useful in the patterning of microelectronic device substrates using extreme ultraviolet light (EUV) techniques. In this regard, see U.S. Patent Publication 2021/0013034, incorporated herein by reference. It is contemplated that the precursor compositions of the invention, in the form of a vapor stream, are mixed with a counter-reactant in a manner which forms an organometallic material in an oligomeric or polymeric form on a microelectronic device surface. In this fashion, the film so formed becomes an EUV-patternable film, given its reactivity with EUV light.

Suitable counter-reactant(s) are those compounds which are capable of replacing the alkoxide or amide groups on the compounds of Formulae (I) and (II) as set forth above, and include materials such as water, peroxides such as hydrogen peroxide, di- or polyhydroxy alcohols, hydrogen sulfide, hydrogen disulfide, trifluoroacetaldehyde monohydrate, fluorinated di- or polyhydroxy alcohols, and fluorinated glycols.

The thin films thus formed are oligomeric or polymeric organometallic materials comprising $SnO_x$, wherein x is about 1.5 to about 2. Additionally, these EUV-patternable thin films generally vary from about 0.5 to about 100 nm in thickness.

In certain embodiments, the pulse time (i.e., duration of precursor exposure to the substrate) for the precursor compounds depicted above ranges between about 1 and 30 seconds. When a purge step is utilized, the duration is from about 1 to 20 seconds or 1 to 30 seconds. In other embodiments, the pulse time for the co-reactant ranges from 5 to 60 seconds.

In one embodiment, the vapor deposition conditions comprise a temperature in the reaction zone of about 0° C. to about 250° C., or about 22° C. to about 150° C., and at a reduced pressure of about 10 mTorr to about 10 Torr.

The precursor composition comprising the precursor compounds described herein can be employed for forming (a) tin-containing films and (b) high-purity EUV-patternable films, when used in conjunction with the counter-reactant materials referred to above. Any suitable vapor deposition technique, such as chemical vapor deposition (CVD), digital (pulsed) CVD, atomic layer deposition (ALD), or a flowable chemical vapor deposition (FCVD) can be utilized. In the case of pulsed vapor deposition, a series of alternating pulses of the precursor composition and counter-reactant(s), either with or without an intermediate (e.g., inert gas) purge step, can be utilized to build up the film thickness to a desired endpoint.

The compounds described herein may be reacted with the counter-reactant(s) and the surface of the desired microelectronic device substrate in a reaction zone in any suitable manner, for example, in a single wafer CVD or ALD, or in a furnace containing multiple wafers.

Alternatively, the processes of the invention can be conducted as an ALD or ALD-like process. As used herein, the terms "ALD or ALD-like" refer to processes such as (i) each reactant including the precursor composition comprising the compounds chosen from Formulae (I) and (II), the counter-reactant(s) are introduced sequentially into a reactor such as a single wafer ALD reactor, semi-batch ALD reactor, or batch furnace ALD reactor, or (ii) each reactant is exposed to the substrate or microelectronic device surface by moving or rotating the substrate to different sections of the reactor and each section is separated by an inert gas curtain, i.e., spatial ALD reactor or roll to roll ALD reactor. In certain embodiments, the thickness of the ALD film may be from about 0.5 nm to about 40 nm and the deposition temperature ranges from about 30° C. to about 500° C.

The deposition methods disclosed herein may involve one or more purge gases. The purge gas, which is used to purge away unconsumed reactants and/or reaction by-products, is an inert gas that does not react with either the precursor composition or the counter-reactant(s). Exemplary purge gases include, but are not limited to, argon, nitrogen, helium, neon, and mixtures thereof. In certain embodiments, a purge gas such as Ar is supplied into the reactor at a flow rate ranging from about 10 to about 2000 sccm for about 0.1 to 1000 seconds, thereby purging the unreacted material and any by-product that may remain in the reactor. Such purge gasses may also be utilized as inert carrier gasses for either or both of the precursor composition and counter-reactant(s).

The respective step of supplying the precursor composition and the counter-reactant(s), may be performed by changing the sequences for supplying them and/or changing the stoichiometric composition of the resulting EUV-patternable film.

Energy is applied to the precursor composition and the co-reactant(s) in the reaction zone to induce reaction and to form the EUV-patternable film on the microelectronic device surface. Such energy can be provided by, but not limited to, thermal, pulsed thermal, plasma, pulsed plasma, helicon plasma, high density plasma, inductively coupled plasma, X-ray, e-beam, photon, remote plasma methods, and combinations thereof. In certain embodiments, a secondary RF frequency source can be used to modify the plasma characteristics at the substrate surface. In embodiments wherein the deposition involves plasma, the plasma-generated process may comprise a direct plasma-generated process in which plasma is directly generated in the reactor, or alternatively, a remote plasma-generated process in which plasma is generated 'remotely' of the reaction zone and substrate, being supplied into the reactor.

As used herein, the term "microelectronic device" corresponds to semiconductor substrates, including 3D NAND structures, flat panel displays, and microelectromechanical systems (MEMS), manufactured for use in microelectronic, integrated circuit, or computer chip applications. It is to be understood that the term "microelectronic device" is not meant to be limiting in any way and includes any substrate that includes a negative channel metal oxide semiconductor (nMOS) and/or a positive channel metal oxide semiconductor (pMOS) transistor and will eventually become a microelectronic device or microelectronic assembly. Such microelectronic devices contain at least one substrate, which can be chosen from, for example, tin, $SiO_2$, $Si_3N_4$, OSG, FSG, tin carbide, hydrogenated tin carbide, tin nitride, hydrogenated tin nitride, tin carbonitride, hydrogenated tin carbonitride, boronitride, antireflective coatings, photoresists, germanium, germanium-containing, boron-containing, Ga/As, a flexible substrate, porous inorganic materials, metals such as copper and aluminum, and diffusion barrier layers such as but not limited to TiN, Ti(C)N, TaN, Ta(C)N, Ta, W, or WN.

In those circumstances where the compounds of Formula (I) and/or (II) are used in conjunction with a co-reactant or counter-reactant, and in particular in EUV patterning, they may be provided in the form of a kit. The containers of the kit must be suitable for storing and shipping said compositions, and advantageously include means for bringing the components in the one or more containers into the reaction zone where the deposition of the tin-containing or EUV-patternable film is formed on the microelectronic device substrate. In addition, the container(s) and system may include a dispensing port for dispensing the composition(s) to a process tool. For example, gas pressure may be applied to the head space of a conventional pressurizable container or a pump may be used to enable fluid communication in the introduction of such components into a reaction zone of a vapor phase deposition instrument. In addition, the system may include a dispensing port for dispensing the components into a process tool.

Accordingly, in a further aspect, the invention provides a kit comprising, in one or more containers, one or more compounds of Formula (I) and/or (II), as described herein, and one or more compounds (i.e., counter-reactants) chosen from water, peroxides, di- or polyhydroxy alcohols, hydrogen sulfide, hydrogen disulfide, trifluoroacetaldehyde monohydrate, fluorinated di- or polyhydroxy alcohols, and fluorinated glycols.

EXAMPLES

Synthesis of 1,3-bis(bis(trimethylsilylamido)iodotin (IV)]Propane

Bis(bis(trimethylsilylamido))tin(II) (5 g, 11.3 mmol) was placed in a 40 mL scintillation vial equipped with a magnetic stir bar and dissolved in hexanes (15 mL) to form a dark orange/red solution. In a separate vial, 1,3-diiodopropane was dissolved in hexanes (10 mL) and transferred to the Sn(II)-containing solution dropwise with stirring over one minutes time. Over the course of addition, the reaction exhibited a slight exotherm, presented as a light-orange solution, and was stirred at room temperature for 1 hour. At this point, the reaction was concentrated by removal of 15 mL of solvent under reduced pressure and the resulting orange solution stored at −35° C. overnight. The following morning the reaction presented as a frozen yellow solid. Upon warming to room temperature yellow crystals suitable for solid-state x-ray crystallography were collected for analysis. The remainder of the reaction contents were dried under reduced pressure to yield the target molecule as a free-flowing yellow powder (4.67 g, 70.4%). $^1$H-NMR ($C_6D_6$, 400 MHz); s, 36H, 0.41 ppm; $^{119}$Sn-NMR ($C_6D_6$, 150 MHz); −153.35 ppm.

ASPECTS

In a first aspect, the invention provides a process for the deposition of a tin-containing film onto a surface of a microelectronic device in a reaction zone, which comprises introducing into the reaction zone, a precursor composition comprising at least one compound chosen from Formula (I):

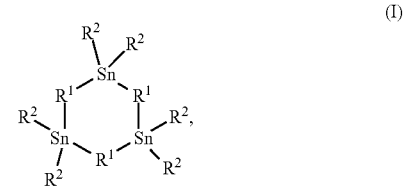

(I)

wherein $R^1$ is a group chosen from —C(R)$_2$, —CR(X)—, —O—, and —N(R)—,
wherein R is chosen from H and $C_1$-$C_5$ alkyl,
wherein X is chosen from F, Cl, Br, I, —OCH$_3$, —OCH$_2$CH$_3$, —OCH$_2$CH$_2$CH$_3$, and —OCH(CH$_3$)$_2$, and
$R^2$ is chosen from H, —N(R)$_2$, —OR, and —$R^1$;
under vapor deposition conditions.

In a second aspect, the invention provides the process of the first aspect, wherein $R^1$ is a group of the formula —N(R).

In a third aspect, the invention provides the process of the first or second aspect, wherein $R^2$ is a group of the formula —N(R)$_2$.

In a fourth aspect, the invention provides the process of any one of the first through the fourth aspects, wherein the vapor deposition conditions are atomic layer deposition conditions.

In a fifth aspect, the invention provides a process for the deposition of a tin-containing film onto a surface of a microelectronic device in a reaction zone, which comprises introducing into the reaction zone, a precursor composition comprising at least one compound chosen from Formula (I):

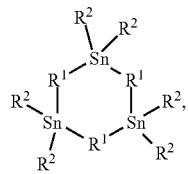

(I)

wherein $R^1$ is a divalent group chosen from —C(R)$_2$—, —CR(X)—, —O—, and —N(R)—, wherein R is chosen from H and C$_1$-C$_5$ alkyl, wherein X is chosen from F, Cl, Br, I, —OCH$_3$, —OCH$_2$CH$_3$, —OCH$_2$CH$_2$CH$_3$, and —OCH(CH$_3$)$_2$, and $R^2$ is chosen from H, —N(R)$_2$, and —OR, and —R$^1$; and at least one counter-reactant chosen from compounds capable of reacting with —OR and —N(R)$_2$, under vapor deposition conditions.

In a sixth aspect, the invention provides a process for making an EUV-patternable film on a surface of a microelectronic device substrate, comprising:

mixing a vapor stream of a precursor composition comprising at least one compound chosen from Formula (I):

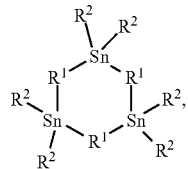

(I)

wherein $R^1$ is a divalent group chosen from —C(R)$_2$—, —CR(X)—, —O—, and —N(R)—, wherein R is chosen from H and C$_1$-C$_5$ alkyl, wherein X is chosen from F, Cl, Br, I, —OCH$_3$, —OCH$_2$CH$_3$, —OCH$_2$CH$_2$CH$_3$, and —OCH(CH$_3$)$_2$, and $R^2$ is chosen from H, —N(R)$_2$, and —OR, and —R$^1$;

with a vapor stream of a counter-reactant so as to form a polymerized organometallic material; and depositing the organometallic material onto the surface of the substrate to form the EUV-patternable film.

In a seventh aspect, the invention provides the process of the fifth or sixth aspect, wherein $R^1$ is a group of the formula —N(R)—.

In an eighth aspect, the invention provides the process of the fifth, sixth, or seventh aspects, wherein $R^2$ is a group of the formula —N(R)$_2$—.

In a ninth aspect, the invention provides the process of any one of the fifth through the eight aspects, wherein the vapor deposition conditions are atomic layer deposition conditions.

In a tenth aspect, the invention provides a process for the deposition of a tin-containing film onto a surface of a microelectronic device in a reaction zone, which comprises introducing into the reaction zone, a precursor composition comprising at least one compound chosen from Formula (II):

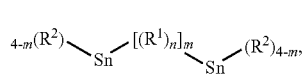

(II)

wherein $R^1$ is a divalent group chosen from —CH$_2$—, —C=C—, —C≡C—, —O—, —N(R)—, —O—R—R—O—, and —CH(X)—, wherein R is chosen from H and C$_1$-C$_5$alkyl, wherein X is chosen from F, Cl, Br, I, —OCH$_3$, —OCH$_2$CH$_3$, —OCH$_2$CH$_2$CH$_3$, and —OCH(CH$_3$)$_2$, n is an integer of from 0 to 5, $R^2$ is chosen from H, —N(R)$_2$, —OR, and —R$^1$; and m is an integer of from 0 to 2, under vapor deposition conditions.

In an eleventh aspect, the invention provides the process of the tenth aspect, wherein $R^1$ is a group of the formula —N(R)—.

In a twelfth aspect, the invention provides the process of the tenth or eleventh aspect, wherein $R^2$ is a group of the formula —N(R)$_2$.

In a thirteenth aspect, the invention provides the process of any one of the tenth through the twelfth aspects, wherein the vapor deposition conditions are atomic layer deposition conditions.

In a fourteenth aspect, the invention provides a process for the deposition of a tin-containing film onto a surface of a microelectronic device in a reaction zone, which comprises introducing into the reaction zone, a precursor composition comprising at least one compound chosen from Formula (II):

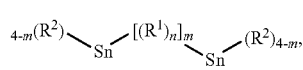

(II)

wherein $R^1$ is a divalent group chosen from —CH$_2$—, —C=C—, —C≡C—, —O—, —N(R)—, —O—R—R—O—, and —CH(X)—, wherein R is chosen from H and C$_1$-C$_5$, alkyl, wherein X is chosen from F, Cl, Br, I, —OCH$_3$, —OCH$_2$CH$_3$, —OCH$_2$CH$_2$CH$_3$, and —OCH(CH$_3$)$_2$, n is an integer of from 0 to 5, $R^2$ is chosen from H, —N(R)$_2$, and —OR, and —R$^1$; and m is an integer of from 0 to 2, and at least one counter-reactant chosen from compounds capable of reacting with —OR and —N(R)$_2$, under vapor deposition conditions.

In a fifteenth aspect, the invention provides a method for making an EUV-patternable film on a surface of a microelectronic device substrate, comprising:

mixing a vapor stream of a precursor composition comprising at least one compound chosen from Formula (II):

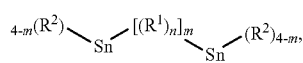

(II)

wherein $R^1$ is a divalent group chosen from —$CH_2$—, —C=C—, —C≡C—, —O—, —N(R)—, —O—R—R—O—, and —CH(X)—,
wherein R is chosen from H and $C_1$-$C_5$ alkyl,
wherein X is chosen from F, Cl, Br, I, —$OCH_3$, —$OCH_2CH_3$, —$OCH_2CH_2CH_3$, and —$OCH(CH_3)_2$,
n is an integer of from 0 to 5,
$R^2$ is chosen from H, —$N(R)_2$, and —OR, and —$R^1$; and
m is an integer of from 0 to 2,
with a vapor stream of a counter-reactant so as to form a polymerized organometallic material; and
depositing the organometallic material onto the surface of the substrate to form the EUV-patternable film.

In a sixteenth aspect, the invention provides the process of the fourteenth or fifteenth aspect, wherein $R^1$ is a group of the formula —N(R)—.

In a seventeenth aspect, the invention provides the process of the fourteenth, fifteenth, or sixteenth aspect, wherein $R^2$ is a group of the formula —$N(R)_2$.

In an eighteenth aspect, the invention provides the process of any one of the fourteenth through seventeenth aspects, wherein the vapor deposition conditions are atomic layer deposition conditions.

In a nineteenth aspect, the invention provides a precursor composition comprising a compound of Formula (I):

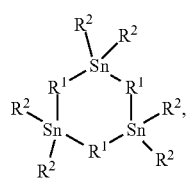

(I)

wherein $R^1$ is a group chosen from —$C(R)_2$—, —CR(X)—, —O—, and —N(R)—,
wherein R is chosen from H and $C_1$-$C_5$ alkyl,
wherein X is chosen from F, Cl, Br, I, —$OCH_3$, —$OCH_2CH_3$, —$OCH_2CH_2CH_3$, and —$OCH(CH_3)_2$, and
$R^2$ is chosen from groups of the formula —$N(R)_2$ and —OR.

In a twentieth aspect, the invention provides a precursor composition comprising a Formula (II):

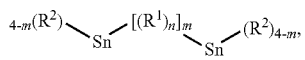

(II)

wherein $R^1$ is a divalent group chosen from —$CH_2$—, —C=C—, —C≡C—, —O—, —N(R)—, —O—R—R—O—, and —CH(X)—,
wherein R is chosen from H and $C_1$-$C_5$ alkyl,
wherein X is chosen from F, Cl, Br, I, —$OCH_3$, —$OCH_2CH_3$, —$OCH_2CH_2CH_3$, and —$OCH(CH_3)_2$,
n is an integer of from 0 to 5,
$R^2$ is a group of the formula —$N(R)_2$, and
m is an integer of from 0 to 2.

In a twenty-first aspect, the invention provides a kit comprising, in one or more containers, one or more compounds of Formula (I) and/or (II), as claimed in the nineteenth and twentieth aspects, and one or more compounds chosen from water, peroxides, di- or polyhydroxy alcohols, hydrogen sulfide, hydrogen disulfide, trifluoroacetaldehyde monohydrate, fluorinated di- or polyhydroxy alcohols, and fluorinated glycols.

Having thus described several illustrative embodiments of the present disclosure, those of skill in the art will readily appreciate that yet other embodiments may be made and used within the scope of the claims hereto attached. Numerous advantages of the disclosure covered by this document have been set forth in the foregoing description. It will be understood, however, that this disclosure is, in many respects, only illustrative. The disclosure's scope is, of course, defined in the language in which the appended claims are expressed.

What is claimed is:

1. A process for the deposition of a tin-containing film onto a surface of a microelectronic device in a reaction zone, which comprises introducing into the reaction zone, a precursor composition comprising at least one compound chosen from Formula (I):

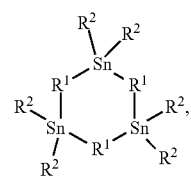

(I)

wherein $R^1$ is a divalent group chosen from —$C(R)_2$—, —CR(X)—, —O—, and —N(R)—,
wherein R is chosen from H and $C_1$-$C_5$ alkyl,
wherein X is chosen from F, Cl, Br, I, —$OCH_3$, —$OCH_2CH_3$, —$OCH_2CH_2CH_3$, and —$OCH(CH_3)_2$, and
$R^2$ is chosen from H, —$N(R)_2$, and —OR, and —$R^1$;
under vapor deposition conditions.

2. The process of claim 1, wherein $R^1$ is a group of the formula —N(R)—.

3. The process of claim 1, wherein $R^2$ is a group of the formula —$N(R)_2$.

4. The process of claim 1, wherein the vapor deposition conditions are atomic layer deposition conditions.

5. A process for the deposition of a tin-containing film onto a surface of a microelectronic device in a reaction zone, which comprises introducing into the reaction zone, a precursor composition comprising at least one compound chosen from Formula (I):

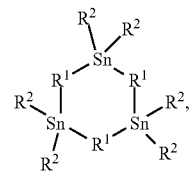

(I)

wherein $R^1$ is a divalent group chosen from —$C(R)_2$—, —CR(X)—, —O—, and —N(R)—,
wherein R is chosen from H and $C_1$-$C_5$ alkyl,
wherein X is chosen from F, Cl, Br, I, —$OCH_3$, —$OCH_2CH_3$, —$OCH_2CH_2CH_3$, and —$OCH(CH_3)_2$, and
$R^2$ is chosen from H, —$N(R)_2$, and —OR, and —$R^1$; and at least one counter-reactant chosen from compounds capable of reacting with —OR and —N(R)$_2$, under vapor deposition conditions.

6. The process of claim 5, wherein R$^1$ is a group of the formula —N(R)—.

7. The process of claim 5, wherein R$^2$ is a group of the formula —N(R)$_2$.

8. The process of claim 5, wherein the vapor deposition conditions are atomic layer deposition conditions.

\* \* \* \* \*